(12) United States Patent
Henry

(10) Patent No.: US 6,388,521 B1
(45) Date of Patent: May 14, 2002

(54) MOS DIFFERENTIAL AMPLIFIER WITH OFFSET COMPENSATION

(75) Inventor: Paul Mike Henry, Tucson, AZ (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/669,399

(22) Filed: Sep. 22, 2000

(51) Int. Cl.$^7$ ................................................ H03F 3/45
(52) U.S. Cl. ........................ 330/258; 330/9; 327/307
(58) Field of Search ................ 330/9, 258; 327/307; 323/313, 314

(56) References Cited

U.S. PATENT DOCUMENTS

| | | | |
|---|---|---|---|
| 4,874,969 A | 10/1989 | Meadows | 307/355 |
| 4,887,048 A | * 12/1989 | Krenik et al. | 330/258 |
| 5,124,663 A | 6/1992 | McEntarfer et al. | 330/9 |
| 5,293,136 A | * 3/1994 | Ryat | 330/258 |
| 5,656,957 A | 8/1997 | Marlow et al. | 327/67 |
| 5,734,297 A | * 3/1998 | Huijsing et al. | 330/258 |
| 5,804,994 A | 9/1998 | Marlow et al. | 327/67 |
| 5,973,487 A | 10/1999 | Henry | 323/280 |
| 6,194,962 B1 | * 2/2001 | Chen | 330/9 |
| 6,225,863 B1 | * 5/2001 | Miwa | 330/9 |

* cited by examiner

*Primary Examiner*—Robert Pascal
*Assistant Examiner*—Khanh Van Nguyen
(74) *Attorney, Agent, or Firm*—Merchant & Gould PC; John W. Branch

(57) ABSTRACT

A differential amplifier with adjustable offset includes a differential pair, a controller, an offset adjuster and an output stage. The differential pair and the output stage can be standard implementations such as, for example, a source-coupled PFETs and a folded-cascode output stage. The offset adjuster includes transistors that can be selectively enabled to form a composite transistor that is connected in parallel with at least one transistor of the differential pair to, in effect, increase the size of the transistor of the differential pair. The controller can reduce offset by causing the offset adjuster to increase the effective size of the appropriate transistor of the differential pair to compensate for device mismatch in the differential amplifier.

21 Claims, 5 Drawing Sheets

US 6,388,521 B1

MOS DIFFERENTIAL AMPLIFIER WITH OFFSET COMPENSATION

FIELD OF THE INVENTION

The present invention relates to differential amplifiers and, more particularly, to offset adjustment in MOS differential amplifiers.

BACKGROUND INFORMATION

MOS integrated circuit differential amplifiers typically include a pair of source-coupled transistors with current sources connected to the drains of the source-coupled pair. Ideally, the sizes of the devices forming the differential amplifier (including the current sources) would be perfectly matched (i.e., identical in size, performance, etc.). However, in practice, the devices are not perfectly matched, resulting in an input offset. In some applications, this offset is undesirable. Some conventional methods to reduce the offset are to trim one or more devices to more closely match the devices. For example, one convention method to trim offset is to use a laser to alter the size of one or more devices in the differential amplifier. Laser trimming typically requires that the integrated circuit be powered on to determine the offset, then powered down to laser trim, and then powered on to verify the laser trimming sufficiently reduced the offset. Laser trimming may be repeated until the offset is within tolerance. Consequently, laser trimming is a relatively long process, which is undesirably in a typical production environment. In addition, the high energy of the laser trimming process can undesirably affect the performance of the integrated circuit by creating holes and electrons in the semiconductor material. Still further, trimming of resistors as in some conventional offset trimming processes may undesirably change other performance parameters in addition to offset.

SUMMARY

In accordance with aspects of the present invention, a differential amplifier with adjustable offset is provided for a variety of applications (e.g., a comparator, bandgap voltage reference, operational amplifier, etc.). In one aspect of the present invention, the differential amplifier includes a differential pair, a controller, an offset adjuster and an output stage. In one embodiment, the differential pair and the output stage are standard implementations such as, for example, source-coupled PFETs and a folded-cascode output stage. However, in accordance with this aspect of the present invention, the offset adjuster includes transistors that can be selectively enabled to form a composite transistor that is connected in parallel with at least one transistor of the differential pair. That is, the offset adjuster can be selectively controlled to enable one or more transistors in the offset adjuster to, in effect, increase the size of one of the transistors of the differential pair. Using this aspect, the controller can reduce offset by causing the offset adjuster to increase the effective size of the appropriate transistor of the differential pair to compensate for device mismatch in the differential amplifier.

In another aspect of the present invention, the offset adjuster includes two sets of transistors, one set being connected in parallel with one transistor of the differential pair, and the other set being connected in parallel with the other transistor of the differential pair. Each set's transistors have binary-weighted sizes (i.e., with the sizes being 1x, 2x, 4x, 8x and so on). This aspect provides a simple system to implement a relatively wide range of effective sizes of either transistor of the differential pair with a relatively small quantization or granularity.

In yet another aspect of the present invention, the offset controller can be reconfigurable. For example, the controller can be implemented to include non-volatile memory to provide a binary-coded control signal to the offset adjuster. This aspect allows for re-adjustment of the offset compensation. For example, the offset compensation can be readjusted in response to changes in device parameters that might occur over time, or in response to different supply voltages, temperature, etc.

DETAILED DESCRIPTION

Figure 1:
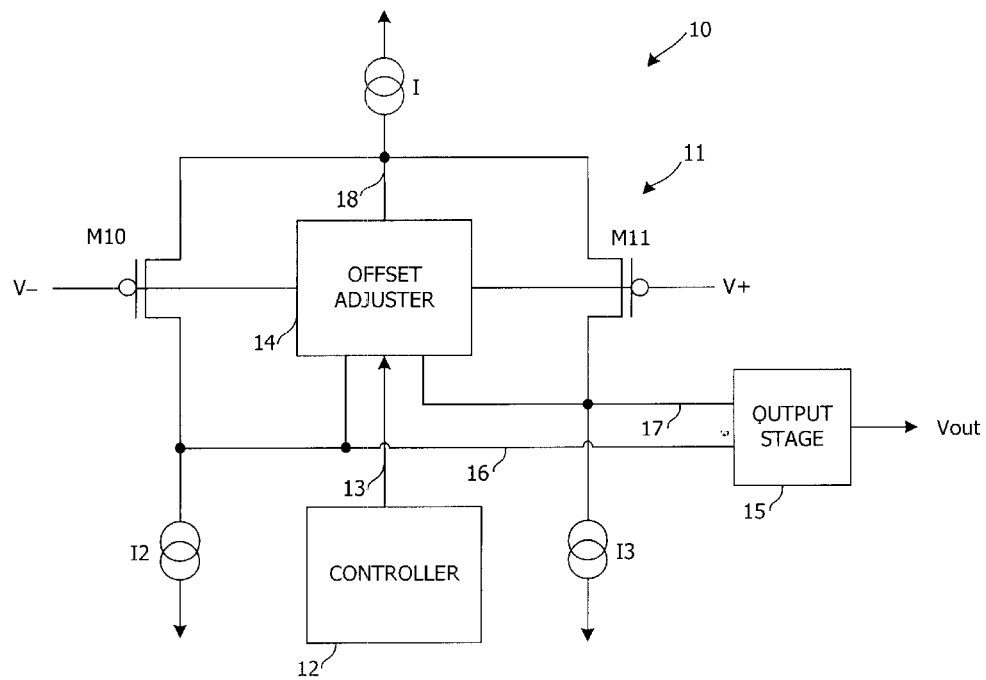
FIG. 1 illustrates a block diagram of a differential amplifier with an adjustable offset in accordance with one embodiment of the present invention.

FIG. 1 illustrates a differential amplifier 10 with offset compensation in accordance with one embodiment of the present invention. Differential amplifier 10 includes a source-coupled pair 11, a controller 12, an offset adjuster 14 and an output stage 15. Controller 12 is connected to offset adjustor 14 through a control line 13. Offset adjuster 14 is connected to the drains of transistors M10 and M11 of source-coupled pair 11 through lines 16 and 17, respectively. In addition, offset adjuster 14 is connected to the sources of source-coupled pair 11. In this embodiment, source-coupled pair 11 is implemented with P-channel transistors M10 and M11, with current source I10 connected to the emitters and current sources I12 and I13 connected to the drains of transistors M10 and M11, respectively. The gates of transistors M10 and M11 respectively receive signals V− and V+. Output stage 15 is connected to lines 16 and 17, and generates an output signal $V_{OUT}$. Ideally, differential amplifier 10 will output a signal with a predetermined level (e.g., zero volts) when signals V− and V+ are have the same voltage level. However, due to imbalances during fabrication of the devices in the circuitry, the voltage levels of signals V− and V+ typically must be different in order to achieve a zero output level. The difference between levels of signals V− and V+ is referred to herein as the offset. This aspect of the present invention compensates for the offset, as described below.

Differential amplifier 10 operates as follows. In a trim mode, voltages V− and V+ are set equal and controller 12 measures the output signal $V_{OUT}$. Controller 12 can be built-in the integrated circuit or external to the integrated circuit. For example, the trim mode may be performed after the integrated circuit is packaged using external test equipment. The controller determines if there is an offset. For example, in one embodiment, if the output signal level measured by controller 12 is not zero, then an offset exists. Controller 12 then provides a control signal to offset adjuster 14 via line 13 in response to this measurement to trim (i.e., reduce) offset.

In response to the control signal from controller 12, offset adjuster 14 adjusts the effective width-to-length ratio of either transistors M10 and M11 to reduce the offset. In particular, if there is an offset, then the magnitude of the gate-to-drain voltage of either transistor M10 and M11 must be increased (i.e., by the offset) in order to achieve a zero level output signal. Say for example that the voltage at the gate of transistor M11 must offset by a positive voltage so that transistor M11 will conduct the same current that transistor M10 conducts (i.e., resulting in an output signal that is zero). Thus, the gate voltage for transistor M11 that achieves this current is the offset voltage summed with voltage level of signal V+. However, by increasing the width-to-length ratio of transistor M11, a lower gate voltage (i.e., the level of signal V+) can achieve the same current. Accordingly, in this case, increasing the width-to-length ratio of transistor M11 reduces the offset. The controller 12 may be configured to try various width-to-length ratios until the output signal is zero. The control signal can then be stored or programmed into the integrated circuit to maintain the proper trimming during normal use. For example, controller 12 may include non-volatile memory (e.g., EPROM or EEPROM) to store the control signal. The use of EPROM or EEPROM advantageously allows the control signal to be changed to readjust the offset compensation in response to changing conditions. One embodiment of how controller 12 controls offset adjuster 14 to change the width-to-length ratios is described below.

In one embodiment, offset adjuster 14 includes two sets of transistors, one of which is connected in parallel with transistor M10 and the other of which is connected in parallel with transistor M11. These sets of transistors are enabled by switches controlled by the control signal from controller 12 to, in effect, increase the width-to-length ratio of either transistor M10 and M11 to compensate for offset caused by device mismatches in the circuitry. One particular embodiment of offset adjuster 14 is described below in conjunction with FIG. 10.

This embodiment advantageously allows differential amplifier 10 to be trimmed quickly and easily in a manufacturing environment, in wafer form both before and after packaging and even after the device has been incorporated into a product and connected to a PC board. In addition, the use of stored control signals allows differential amplifier 10 to be easily used in a mixed signal circuit compared to some conventional laser trimming techniques. For example, some conventional laser trimming requires powering up of the integrated circuit to test, then powering down to perform laser trimming, and then powering up again to determine if the laser trimming was adequate. This cycle is often repeated many times in the trimming operation of a precision integrated circuit. In addition, the high energy of the laser trimming process can undesirably affect the performance of the integrated circuit by creating holes and electrons in the semiconductor material. Before further trimming or testing can be performed, the holes and electrons must be allowed to recombine and this can take valuable test and measurement time. Still further laser trimming of resistors as in some conventional processes may undesirably change other performance parameters in addition to offset, especially in the analog circuitry of mixed-signal circuits. The use of controller 12 and offset adjuster 14 avoids these problems by controlling the trimming process electronically.

Although the above-described embodiments allow for increasing the effective width-to-length ratio of either transistor M10 or transistor M11, in view of this disclosure, those skilled in the art of differential amplifiers can implement embodiments in which the effective width-to-length ratio of both transistors M10 and M11 can be changed. For example, the sizes of the transistors in one set can be different from the sizes of the transistors in the other set. The controller can then activate transistors from both sets of transistors in the offset adjuster to increase the number of effective width-to-length ratios (of transistors M10 and M11) that are available for compensation of offset in transistors M10 and M11. In other embodiments, the transistors of each set of transistors in the offset adjuster can be weighted using a radix that is different from the radix 2 weighting of the embodiment described above. For example, a radix 1.6 weighting can be used in other embodiments.

Figure 2:
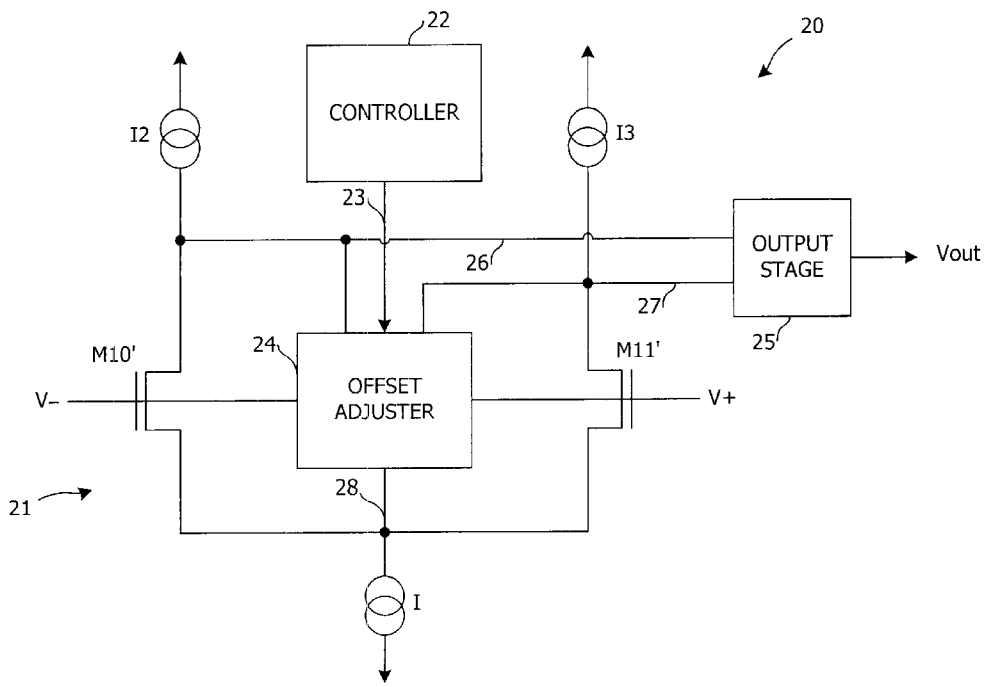
FIG. 2 illustrates a block diagram of a differential amplifier with an adjustable offset in accordance with another embodiment of the present invention.

FIG. 2 illustrates a differential amplifier 20 according to another embodiment of the present invention. Differential amplifier 20 includes a source-coupled pair 21, a controller 22, an offset adjuster 24 and an output stage 25. This embodiment is essentially the same as differential amplifier 10 (FIG. 1) except that source-coupled pair 21 is implemented with N-channel transistors M10' and M11' instead of the P-channel transistors M10 and M11 of source-coupled pair 11 (FIG. 1). The conductivity of the field effect transistors in offset adjuster 24 and output stage 25 may be reversed as compared to offset adjuster 14 and output stage 15 (FIG. 1) to be compatible with the N-channel transistors of source-coupled pair 21. Except for the change in conductivity, differential amplifier 20 operates in substantially the same manner as described above for differential amplifier 10.

Figure 3:
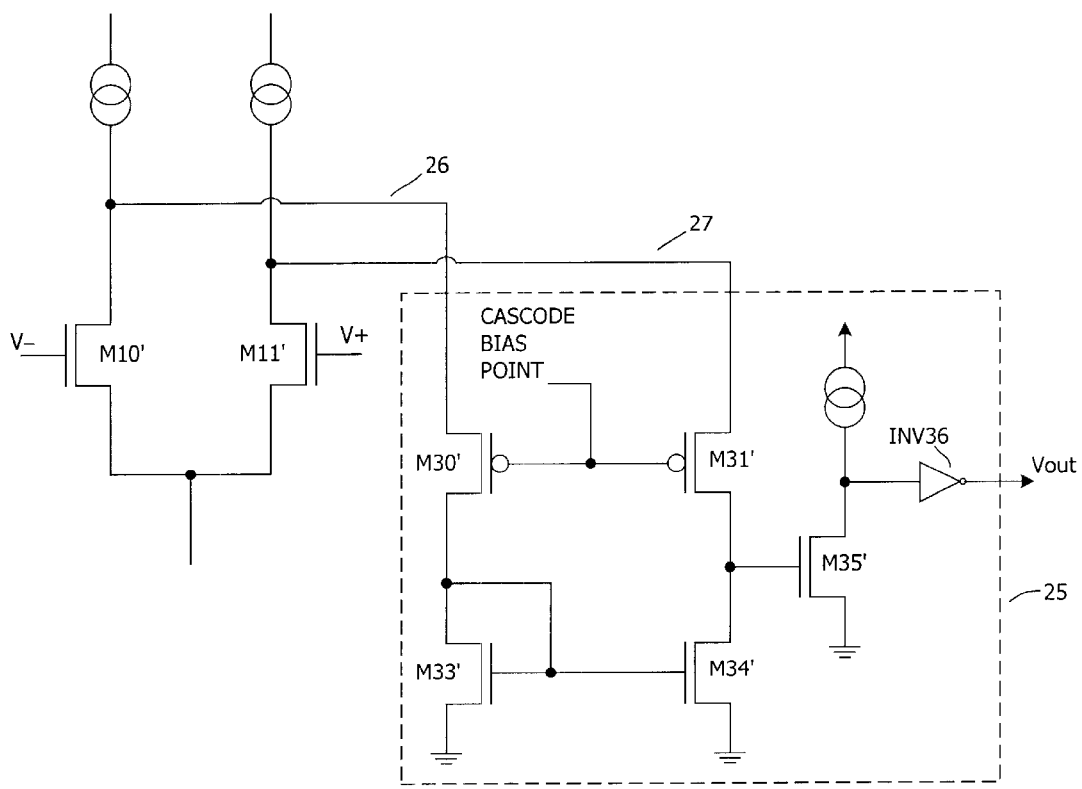
FIG. 3 illustrates an output stage as shown in FIG. 2, in accordance with one embodiment of the present invention.

FIG. 3 illustrates output stage 25 (FIG. 2) according to one embodiment of the present invention. This embodiment of output stage 25 is used as part of a comparator. In this embodiment, output stage 25 includes P-channel transistors M30' and M31', N-channel transistors M33', M34' and M35', a current source and an inverter INV36. Transistors M30' and M31' are the cascode transistors for the source-coupled pair of input transistors M10' and M11', and theses transistors, in conjunction with transistors M33' and M34' implement a folded cascode amplifier stage.

This embodiment of output stage 25 is interconnected as follows. The sources of P-channel transistors M30' and M31' are connected to transistors M10' and M11' via lines 26 and 27 respectively. The gates of P-channel transistors M30' and M31' are connected to receive a bias voltage, referred to in FIG. 4 as the cascode bias point. This bias voltage is generated by biasing circuitry (not shown), which in view of this disclosure can be implemented by those skilled in the art without undue experimentation. The drains of transistors M33' and M34' are respectively connected to the drains of transistors M30' and M31'. In addition, transistors M33' and M34' have their sources connected to the ground bus and their gates connected to the drain of transistor M33'. Thus, transistors M33' and M34' form a current mirror. Transistor M35' has its gate connected to the drain of transistor M31', its source connected to the ground bus, and its drain connected to a current source and the input lead of inverter INV36. The folded cascode configuration of this embodiment of output stage 25 provides high gain and high output resistance, which is then used to drive transistor M35' and inverter INV36 to implement a comparator.

Figure 4:
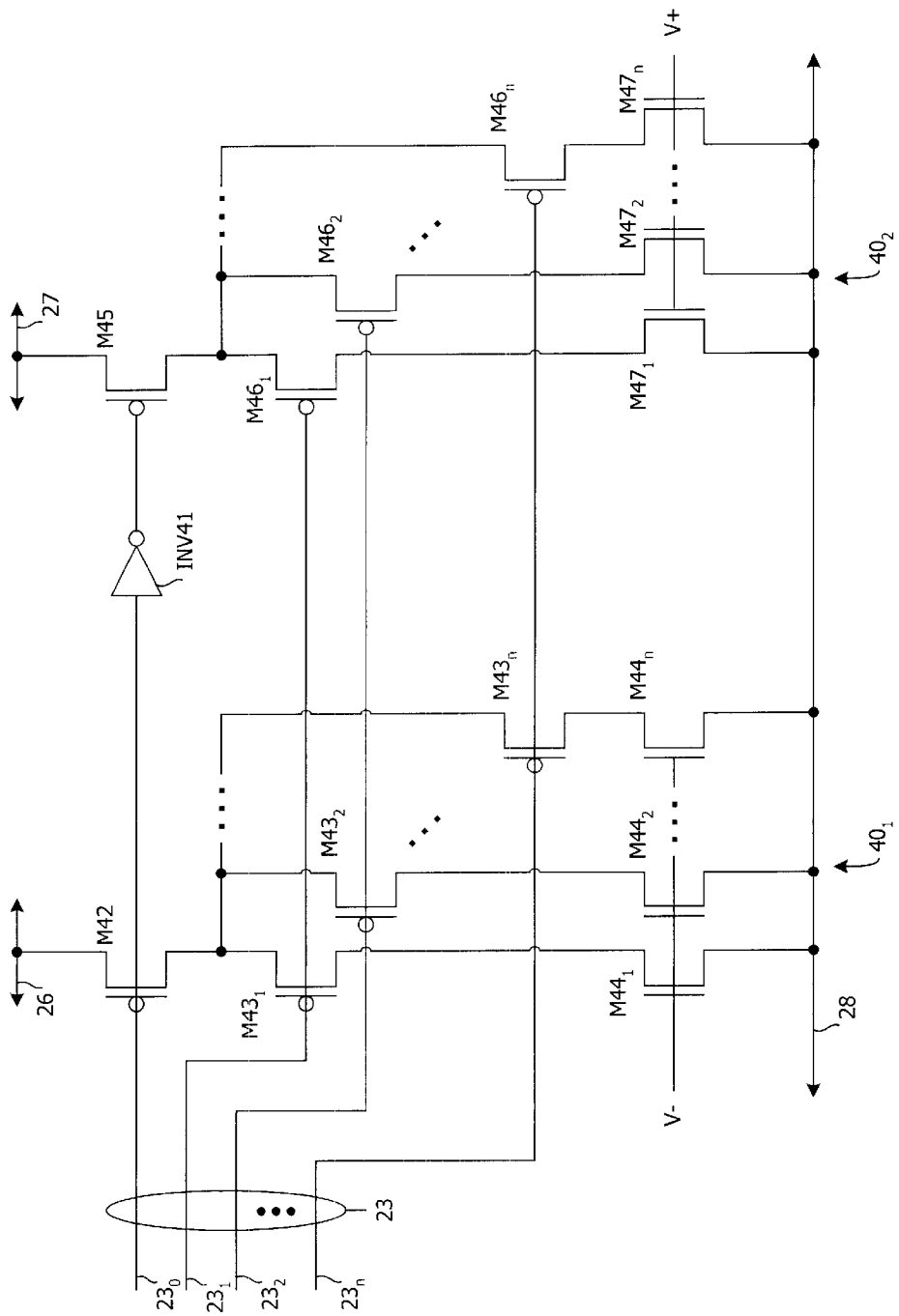
FIG. 4 illustrates an offset adjuster as shown in FIG. 2, in accordance with one embodiment of the present invention.

FIG. 4 illustrates offset adjuster 24 (FIG. 2), in accordance with one embodiment of the present invention. In this embodiment, offset adjuster 24 includes a first set of transistors 401, a second set of transistors 402 and an inverter INV41. The first set of transistors includes P-channel transistors M42 and $M43_1$–$M43_n$ and N-channel transistors $M44_1$–$M44_n$. The second set of transistors includes P-channel transistors M45 and $M46_1$–$M46_n$ and N-channel transistors $M47_1$–$M47_n$. In this embodiment, the control signal provided by controller 22 (FIG. 2) through line 23 has n+1 bits. That is, in this embodiment, line 23 is a bus that is n+1 bits wide, with individual lines $23_0$–$23_n$. Line $23_0$ carries a select signal that selects either first set of transistors $40_1$ or second set of transistors $40_2$. Lines $23_1$–$23_n$ carry signals that enable corresponding transistors of the first and second groups of transistors $40_1$ and $40_2$. In typical embodiments, n represents an integer ranging from 1 to 6. However, in light of the present disclosure, those skilled in the art of differential amplifiers will appreciate that n can represent any positive integer.

The elements of this embodiment of offset adjuster 24 are interconnected as follows. N-channel transistors $M44_1$–$M44_n$ have their sources connected to line 28 and their gates are connected to receive signal V−. N-channel transistors $M47_1$–$M47_n$ also have their sources connected to line 28, but their gates are connected to receive signal V+. The drains of transistors $M44_1$–$M44_n$ and $M47_1$–$M47_n$ are connected to the drains of P-channel transistors $M43_1$–$M43_n$ and to $M46_1$–$M46_n$, respectively. P-channel transistors $M43_1$–$M43_n$ have their gates connected to lines $23_1$–$23_n$, respectively. Similarly P-channel transistors $M46_1$ and $M46_n$ have their gates connect to lines $23_1$–$23_n$, respectively. The sources of transistors $M43_1$–$M43_n$ are connected to the drain of P-channel transistor M42. Transistor M42 has its gate connected to line 230 and has its source connected to line 26. Similarly, the sources of transistors $M46_1$–$M46_n$ are connected to the drain of P-channel transistor M45, which has its gate coupled to line 230 through inverter INV41 and has its source connected to line 27. In this embodiment, the width-to-length ratio of transistor $M44_1$ is half that of transistor $M44_2$, which is half that of transistor $M44_3$ and so on. Similarly, the width-to-length ratio of transistor $M47_1$ is half that of transistor $M47_2$ and so on. In this way, the transistors sizes have a binary weighting and will be enabled according to the n-bit binary number provided on lines $23_1$–$23_n$. Of course, different weighting schemes can be used in other embodiments.

This embodiment of offset adjuster 24 operates as follows. Controller 22 (FIG. 2) generates the n-bit control signal so that line $23_0$ carries the signal that selects either transistors $M43_1$–$M43_n$ or, via inverter INV41, selects transistors $M46_1$–$M46_n$. Controller 22 turns on a combination of transistors $M43_1$–$M43_n$ (or $M46_1$–$M46_n$) by appropriate signals on lines $23_1$–$23_n$. For example, if the signal on line $23_0$ is at a logic low level, then transistor M42 is turned on, thereby selecting the first set of transistors $40_1$ (i.e., $M43_1$–$M43_n$ and $M44_1$–$M44_n$). The control signals on lines $23_1$–$23_n$ then selectively turn on transistors $M43_1$–$M43_n$ so that, in combination with corresponding transistors $M44_1$–$M44_n$, the enabled transistors form, in effect, a single composite transistor with transistor M10' (FIG. 2). Effectively, the transistors $M43_1$–$M43_n$ act as switches selecting the transistors $M44_1$–$M44_n$ and putting the selected transistors in parallel with the input transistor M10. In one embodiment, the sizes of the switch transistors $M43_1$–$M43_n$ have binary weighting as well as transistors $M44_1$–$M44_n$, although in other embodiments the switch transistors need not be so weighted. As previously described, the size of this composite transistor affects the offset of the differential amplifier. By appropriately selecting which transistors are turned on, controller 22 can significantly reduce offset. For example, to compensate for a relatively large offset, most or all of transistors $M43_1$–$M43_n$ would be enabled. For a relatively small offset, perhaps only transistors $M43_1$ or $M43_2$ would be enabled.

In light of this description, those skilled in the art of differential amplifiers will appreciate that offset adjuster 10 can be implemented in substantially the same manner, with the exception that power buses and the conductivities of the field effect transistors would be interchanged, and the control signals on lines $23_0$–$23_n$ would be complemented.

Figure 5:
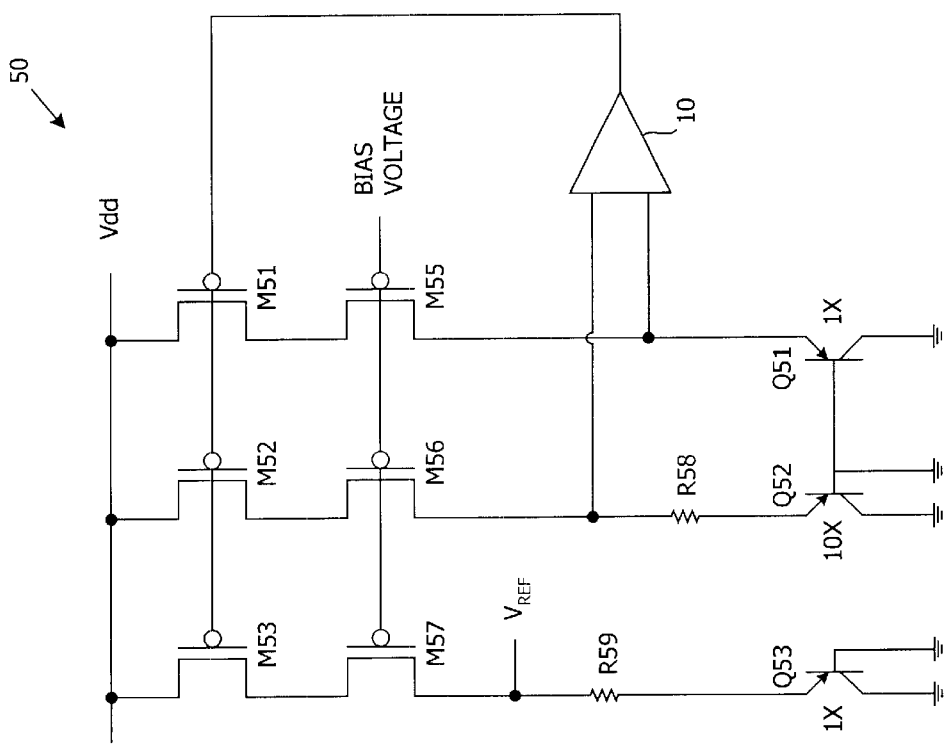
FIG. 5 illustrates a block diagram of a bandgap reference with an adjustable offset differential amplifier as shown in FIG. 1, according to one embodiment of the present invention.

FIG. 5 illustrates an application for a differential amplifier with offset compensation according to the present invention. In this example, the differential amplifier 10 (FIG. 1) is used in a bandgap reference 50. Bandgap reference 50 also includes P-channel transistors M51–M53, M55–M57, resistors R58 and R59, and diode-connected PNP transistors Q51–Q53. The sizes of transistors M51–M53 are matched, and the sizes of transistors M55–M57 are matched. Transistors Q51–Q53 are sized so that transistor Q52 is ten times the size of both transistors Q51 and Q53. The interconnection of these elements is described below. As will be appreciated by those skilled in the art, start-up circuitry would typically be included in bandgap reference 50. Typical start-up circuitry does not affect the operation or offset of the differential amplifier and, therefore, is omitted for clarity in FIG. 5.

P-channel transistors M51–M53 have their sources connected to a Vdd bus, their gates connected to the output lead of differential amplifier 10, and their drains connected to the sources of P-channel transistors M55–M57, respectively. P-channel transistors M55–M57 have their gates connected to receive a bias voltage. In this embodiment, the bias voltage is the same as used for a cascode bias point in output stage 25 (FIG. 3). In other embodiments, the cascode bias points are generated independently. In addition, the drain of transistor M55 is connected to the emitter of PNP transistor Q51, while the drains of transistors M56 and M57 are coupled to the emitters of PNP transistor Q52 and Q53 through resistors R58 and R59, respectively. The bases and collectors of transistors Q51–Q53 are connected to the ground bus.

This embodiment of bandgap reference 50 is substantially similar to a standard bandgap reference, with the exception that bandgap reference 50 provides for offset rimming through differential amplifier 10. This offset rimming would be used to remove the offset from the amplifier 10 and any mismatch between the transistors M52 and M51. In this embodiment, the circuit is designed such that the currents in Q52 and Q51 are intended to be identical and as such, any mismatch results in errors that reduce the performance of the reference. In other embodiments, the bandgap reference can be implemented using different circuitry. This different circuitry may be formed, for example, by replacing transistors M55–M56 M52 and M51 with resistors, or by omitting the leg formed by transistors M53, M57 and Q53, and resistor R59.

Differential amplifier 10 operates to cause the current through diode-connected transistors Q51 and Q52 to be equal. Any input offset in the differential amplifier gets amplified, resulting in an error in the bandgap voltage. Thus, even a small offset can result in significant error in the bandgap voltage. For example, it is not uncommon for offset to reach 10 mV in a MOS process. With the gain of a bandgap cell, the resulting error in the bandgap voltage may range from 40 mV to 90 mV or more. Consequently, it is very desirable to "zero" the offset of the amplifier in a bandgap reference. As described above in conjunction with FIG. 1, offset in differential amplifier 10 can be reduced by appropriately increasing the effective size of one transistor of the differential pair to compensate for device mismatch in differential amplifier 10. Since the polarity of the offset will vary depending on the random manufacturing errors, the ability to select the polarity of the trimming is also provided for in this embodiment.

In another embodiment, differential amplifier 10 can have one transistor of its differential pair being much larger than the other transistor. In this embodiment, offset adjuster 14 has just one set of transistors that is connected to selectively increase the effective size of the smaller transistor of the differential pair. This embodiment may be advantageously used in applications in which the capacitive load at the input nodes of the differential amplifier need not be closely matched.

Figure 6:
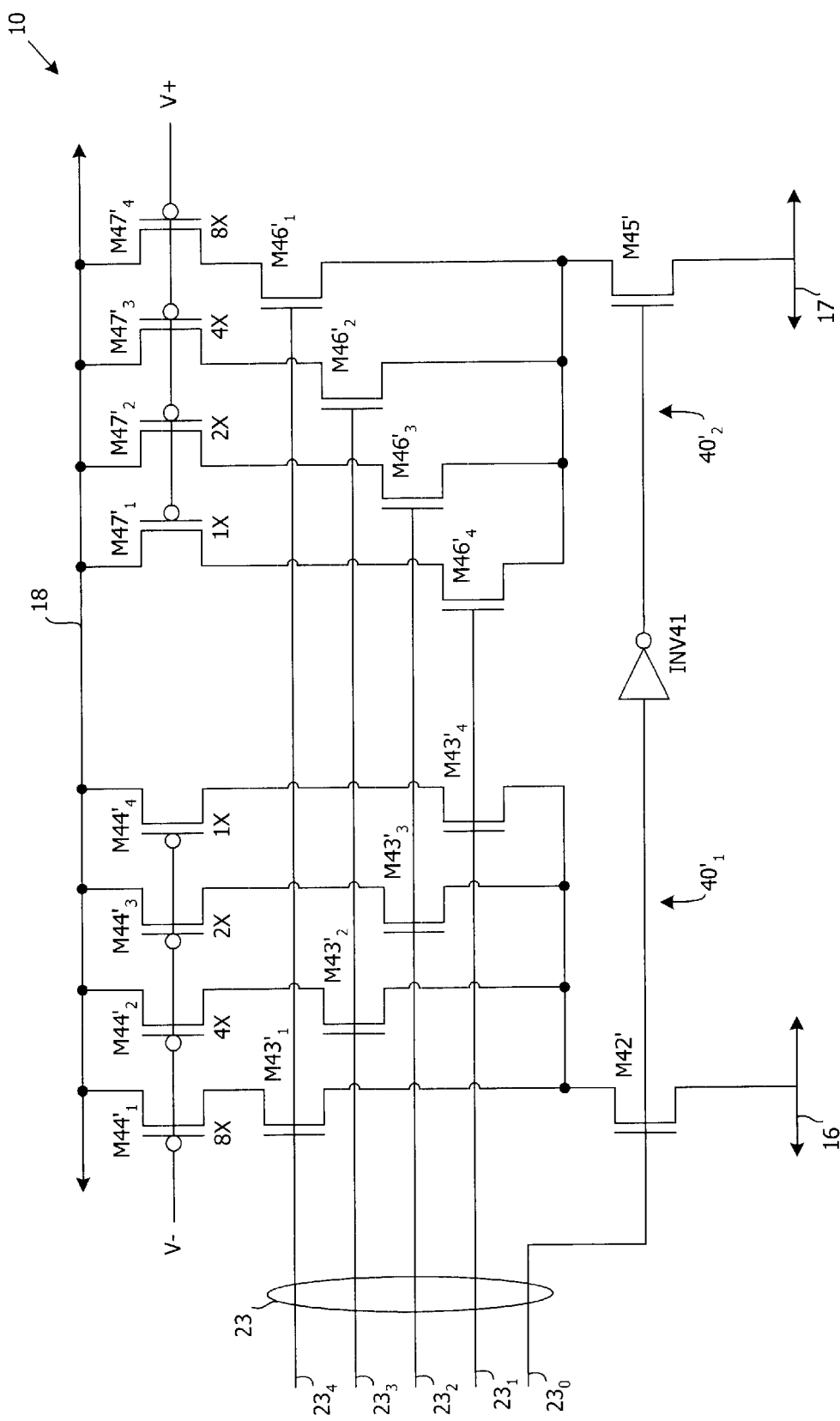
FIG. 6 illustrates an offset adjuster for use in adjustable offset differential amplifier as shown in FIG. 1, according to one embodiment of the present invention.

FIG. 6 illustrates offset adjuster 14 (FIG. 1), according to one embodiment of the present invention. In this embodiment, offset adjuster 14 is substantially similar to offset adjuster 24 (FIG. 3), except that the conductivities of the field effect transistors are reversed. In FIG. 6, this reversal is indicated by a prime symbol, e.g., $M44_1'$ (FIG. 6) is a P-channel device whereas $M44_1$ (FIG. 3) is a N-channel device). Further, in this embodiment, n is set to 4.

Specifically, the elements of offset adjuster 14 are interconnected as follows. P-channel transistors $M44_1'$–$M44_n'$ have their sources connected to line 18 and their gates are connected to receive signal V−. P-channel transistors $M46_1'$–$M47_4'$ also have their sources connected to line 18, but their gates are connected to receive signal V+. The drains of transistors $M44_1'$–$M44_4'$ and $M47_1'$–$M47_4'$ are connected to the drains of N-channel transistors $M43_1'$–$M43_4'$ and to $M46_1'$–$M46_4'$, respectively. N-channel transistors $M43_1'$–$M43_4'$ have their gates connected to lines $23_1$–$23_4$, respectively. Similarly N-channel transistors $M46_1'$ and $M46_4'$ have their gates connected to lines $23_1$–$23_n$, respectively. The sources of transistors $M43_1'$–$M43_4'$ are connected to the drain of N-channel transistor M42'. Transistor M42' has its gate connected to line $23_0$ and has its source connected to line 16. Similarly, the sources of transistors $M46_1'$–$M46_4'$ are connected to the drain of N-channel transistor M45', which has its gate coupled to line $23_0$ through inverter INV41 and has its source connected to line 17. In this embodiment, the width-to-length ratio of transistor $M44_1'$ is half that of transistor $M44_2'$, which is half that of transistor $M44_3'$, which is half that of transistor $M44_4'$. Similarly, the width-to-length ratio of transistor $M47_1'$ is half that of transistor $M47_2'$ and so on. In this way, the transistors sizes have a binary weighting and will be enabled according to the 4-bit binary number provided on lines $23_1$–$23_4$.

This embodiment of offset adjuster 14 operates as follows. During normal operation, controller 22 (FIG. 2) generates the 4-bit control signal so that line $23_0$ carries the signal that selects either transistors $M43_1'$–$M43_4'$ or, via inverter INV41, selects transistors $M46_1'$–$M46_4'$. Controller 22 turns on a combination of transistors $M43_1'$–$M43_4'$ (or $M46_1'$–$M46_4'$) by appropriate signals on lines $23_1$–$23_4$. For example, if the signal on line $23_0$ is at a logic low level, then transistor M45' is turned on, thereby selecting the second set of transistors $40_2'$ (i.e., $M46_1'$–$M46_4'$ and $M47_1'$–$M47_4'$). The control signals on lines $23_1$–$23_4$ then selectively turn on transistors $M46_1'$–$M46_4'$ so that, in combination with corresponding transistors $M47_1'$–$M47_4'$, the enabled transistors form, in effect, a single composite transistor with transistor M11 (FIG. 2).

The above specification, examples and data provide a complete description of the manufacture and use of the composition of the invention. Since many embodiments of the invention can be made without departing from the spirit and scope of the invention, the invention resides in the claims hereinafter appended.

I claim:

1. An differential amplifier, comprising:
    a differential pair including a first transistor and a second transistor, the first transistor having a terminal couplable to receive a first input signal and the second transistor having a terminal couplable to receive a second input signal, the first and second input signals forming a differential signal;
    an offset adjuster coupled to the differential pair, wherein the offset adjuster is configurable to adjust a relative size between the first and second transistors;
    an output stage coupled to the differential pair; and
    a controller having a control line that is couplable to the offset adjuster, wherein the controller is configured to provide a control signal to the offset adjuster to cause the offset adjuster to change the relative size between the first and second transistors to compensate for offset in the differential amplifier.

2. The circuit of claim 1, wherein the control signal is a multi-bit signal.

3. The circuit of claim 1, wherein the controller comprises a memory device, the controller being configured to provide the control signal as a function of a value stored in the memory device.

4. The circuit of claim 3, wherein the memory device comprises rewritable nonvolatile memory device.

5. The circuit of claim 1, wherein the offset adjuster includes:
    a first set of transistors including a first pair of transistors, one transistor of the first pair of transistors having a gate electrically connected to the control line and another transistor of the first pair of transistors having a gate connected to receive the first input signal, wherein in response to the control signal the first pair of transistors is configurable to provide a conductive path in parallel with a conductive path of the first transistor; and
    a second set of transistors including a second pair of transistors, one transistor of the second pair of transistors having a gate electrically connected to the control line and another transistor of the second pair of transistors having a gate connected to receive the second input signal, wherein in response to the control signal the second pair of transistors is configurable to provide a conductive path in parallel with a conductive path of the second transistor.

6. The circuit of claim 5, wherein the first and second sets of transistors each include a plurality of pairs of transistors.

7. The circuit of claim 6, wherein the pairs of transistors in each of the first and second sets of transistors are binary weighted.

8. A comparator, comprising:
    a differential pair including a first transistor and a second transistor, the first transistor having a terminal couplable to receive a first input signal and the second transistor having a terminal couplable to receive a second input signal;
    an offset adjuster coupled to the differential pair, wherein the offset adjuster is configurable to adjust a relative size between the first and second transistors;

an output stage coupled to the differential pair, wherein the output stage is configured to output a digital signal in response to the first and second input signals; and a controller having a control line that is couplable to the offset adjuster, wherein the controller is configured to provide a control signal to the offset adjuster to cause the offset adjuster to change the relative size between the first and second transistors to compensate for offset in the differential amplifier.

9. The comparator of claim 8, wherein the control signal is a multi-bit signal.

10. The comparator of claim 8, wherein the offset adjuster includes:

a first set of transistors including a first pair of transistors, one transistor of the first pair of transistors having a gate electrically connected to the control line and another transistor of the first pair of transistors having a gate connected to receive the first input signal, wherein in response to the control signal the first pair of transistors is configurable to provide a conductive path in parallel with a conductive path of the first transistor; and a second set of transistors including a second pair of transistors, one transistor of the second pair of transistors having a gate electrically connected to the control line and another transistor of the second pair of transistors having a gate connected to receive the second input signal, wherein in response to the control signal the second pair of transistors is configurable to provide a conductive path in parallel with a conductive path of the second transistor.

11. The comparator of claim 10, wherein the first and second sets of transistors each include a plurality of pairs of transistors.

12. The comparator of claim 11, wherein the pairs of transistors in each of the first and second sets of transistors are binary weighted.

13. The comparator of claim 8, wherein the controller comprises a rewritable memory device, the controller being configured to provide the control signal as a function of a value stored in the memory device.

14. The comparator of claim 13, wherein the controller is configurable to change the value stored in memory device in response to changing conditions in the comparator.

15. A bandgap reference, comprising:

a differential pair including a first transistor and a second transistor, the first transistor having a first terminal couplable to receive a first input signal and the second transistor having a second terminal couplable to receive a second input signal;

an offset adjuster coupled to the differential pair, wherein the offset adjuster is configurable to adjust a relative size between the first and second transistors;

an output stage coupled to the differential pair, wherein the output stage is configured to output a signal as a function of a difference between the first and second input signals;

a controller having a control line that is couplable to the offset adjuster, wherein the controller is configured to provide a control signal to the offset adjuster to cause the offset adjuster to change the relative size between the first and second transistors to compensate for offset in the differential amplifier;

a third transistor coupled to the first terminal of the differential pair;

a fourth transistor coupled to the second terminal of the differential pair through a resistor, the third and fourth transistors having different sizes; and a current source coupled to the output lead of the output stage and the third and fourth transistors, wherein the current source is configured to provide a current with a level that is responsive to the output signal of the output stage.

16. The bandgap reference of claim 15, wherein the control signal is a multi-bit signal.

17. The bandgap reference of claim 15, wherein the offset adjuster includes:

a first set of transistors including a first pair of transistors, one transistor of the first pair of transistors having a gate electrically connected to the control line and another transistor of the first pair of transistors having a gate connected to receive the first input signal, wherein in response to the control signal the first pair of transistors is configurable to provide a conductive path in parallel with a conductive path of the first transistor; and a second set of transistors including a second pair of transistors, one transistor of the second pair of transistors having a gate electrically connected to the control line and another transistor of the second pair of transistors having a gate connected to receive the second input signal, wherein in response to the control signal the second pair of transistors is configurable to provide a conductive path in parallel with a conductive path of the second transistor.

18. The bandgap reference of claim 17, wherein the first and second sets of transistors each include a plurality of pairs of transistors.

19. The bandgap reference of claim 18, wherein the pairs of transistors in each of the first and second sets of transistors are binary weighted.

20. The bandgap reference of claim 15, wherein the controller comprises a rewritable memory device, the controller being configured to provide the control signal as a function of a value stored in the memory device.

21. An differential amplifier, comprising:

a differential pair including a first transistor and a second transistor, the first transistor having a terminal couplable to receive a first input signal and the second transistor having a terminal couplable to receive a second input signal, the first and second input signals forming a differential signal;

adjuster means, coupled to the differential pair, for adjusting a relative size between the first and second transistors;

an output stage coupled to the differential pair; and a controller having a control line that is couplable to the adjuster means, wherein the controller is configured to provide a control signal to the adjuster means to cause the adjuster means to change the relative size between the first and second transistors to compensate for offset in the differential amplifier.

* * * * *